(12) United States Patent
Han et al.

(10) Patent No.: US 6,545,873 B1
(45) Date of Patent: Apr. 8, 2003

(54) SYSTEM AND METHOD FOR EXTRACTING HEAT FROM A PRINTED CIRCUIT BOARD ASSEMBLY

(75) Inventors: Jake J. Han, Coppell, TX (US); Mitchell Kevin Johnson, McKinney, TX (US)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/676,383

(22) Filed: Sep. 29, 2000

(51) Int. Cl.[7] .............................. H05K 7/00; H05K 7/20; H05K 1/00
(52) U.S. Cl. ........................ 361/728; 361/688; 174/252
(58) Field of Search ................. 174/250–263, 174/15.2; 165/80.1–80.5, 72–75, 104.11–104.19, 104.21–104.29, 104.31–104.34; 361/676–678, 687–704, 707, 709–726, 728; 257/718, 720

(56) References Cited

U.S. PATENT DOCUMENTS

| | | | |
|---|---|---|---|
| 5,268,812 A | * 12/1993 | Conte | 361/698 |
| 5,331,510 A | * 7/1994 | Ouchi | 361/702 |
| 5,781,409 A | * 7/1998 | Mercredy, III | 361/687 |
| 6,175,493 B1 | * 1/2001 | Gold | 361/687 |

* cited by examiner

*Primary Examiner*—David Martin
*Assistant Examiner*—Michael L. Lindinger

(57) ABSTRACT

There is disclosed a printed circuit board assembly mounting tray combined with a hinged thermal tray. The thermal tray, having a plurality of heat pipes and a thermal hinge, transfers heat gathered from heat sources scattered on the printed circuit board assembly and conducted to the mounting tray. The thermal hinge provides a heat transfer connection between the thermal tray and an external heat dissipation apparatus. Additionally, the thermal tray and thermal hinge combination provides easy inspection, board installation and serviceability.

20 Claims, 5 Drawing Sheets

SYSTEM AND METHOD FOR EXTRACTING HEAT FROM A PRINTED CIRCUIT BOARD ASSEMBLY

TECHNICAL FIELD OF THE INVENTION

The present invention is directed, in general, to heat transfer and, more specifically, to a system for extracting heat from electrical devices on a printed circuit board assembly.

BACKGROUND OF THE INVENTION

In general, most printed circuit board assemblies (PBAs) contain one or two heat generating sources that necessitate heat removal devices. In many cases a PBA is assembled with many low heat generating components such as capacitors, diodes and transistors. Although each device generates very little heat so that individually the heat can be ignored, the cumulative heat from the combined devices can be substantial. Furthermore, it is more difficult to extract heat from the scattered heat sources (devices) than it would be to extract heat from a single high heat source.

Generally, heat is usually extracted from a concentrated heat source by either heat sink or fan or both. Integrating fans into the PBA to remove heat has typically proven to produce a relatively unreliable PBA due to interference by the fan motor. Most heat producing devices are mounted directly to a heat sink, but only if there is room for the heat sink and if there are only one or two heat generating devices on the PBA. In most cases, PBAs are assembled with surface mount devices that require components to be soldered on the bottom of the printed circuit board assembly. This creates a mounting problem because of the potential short circuits between solder connections that could occur because of a metal mounting tray.

There is therefore a need in the art for providing a system and method that will transfer heat from heat producing devices that are scattered over a printed circuit board assembly. It would further be desirable to provide a system and method for passive heat transfer that did not interfere with individual devices on board the printed circuit board assembly.

SUMMARY OF THE INVENTION

To address the above-discussed deficiencies of the prior art, it is a primary object of the present invention to provide, a passive heat transfer system for use in a printed circuit board assembly.

It is a further object of the present invention to provide a system for transferring heat away from multiple, scattered components on a printed circuit board assembly.

It is still another object of the present invention to provide a system for transferring heat from multiple scattered components on the printed circuit board assembly and allow easy access for installation and service to the PCB.

The foregoing objects are achieved as is now described. A printed circuit board assembly mounting tray combined with a hinged thermal tray. The thermal tray, having a plurality of heat pipes and a thermal hinge, transfers heat gathered from heat sources scattered on the printed circuit board assembly and conducted to the mounting tray. The thermal hinge provides a heat transfer connection between the thermal tray and an external heat dissipation apparatus. Additionally, the thermal tray and thermal hinge combination provides easy inspection, board installation and serviceability.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged heat transfer device for a printed circuit board assembly.

Figure 1A:
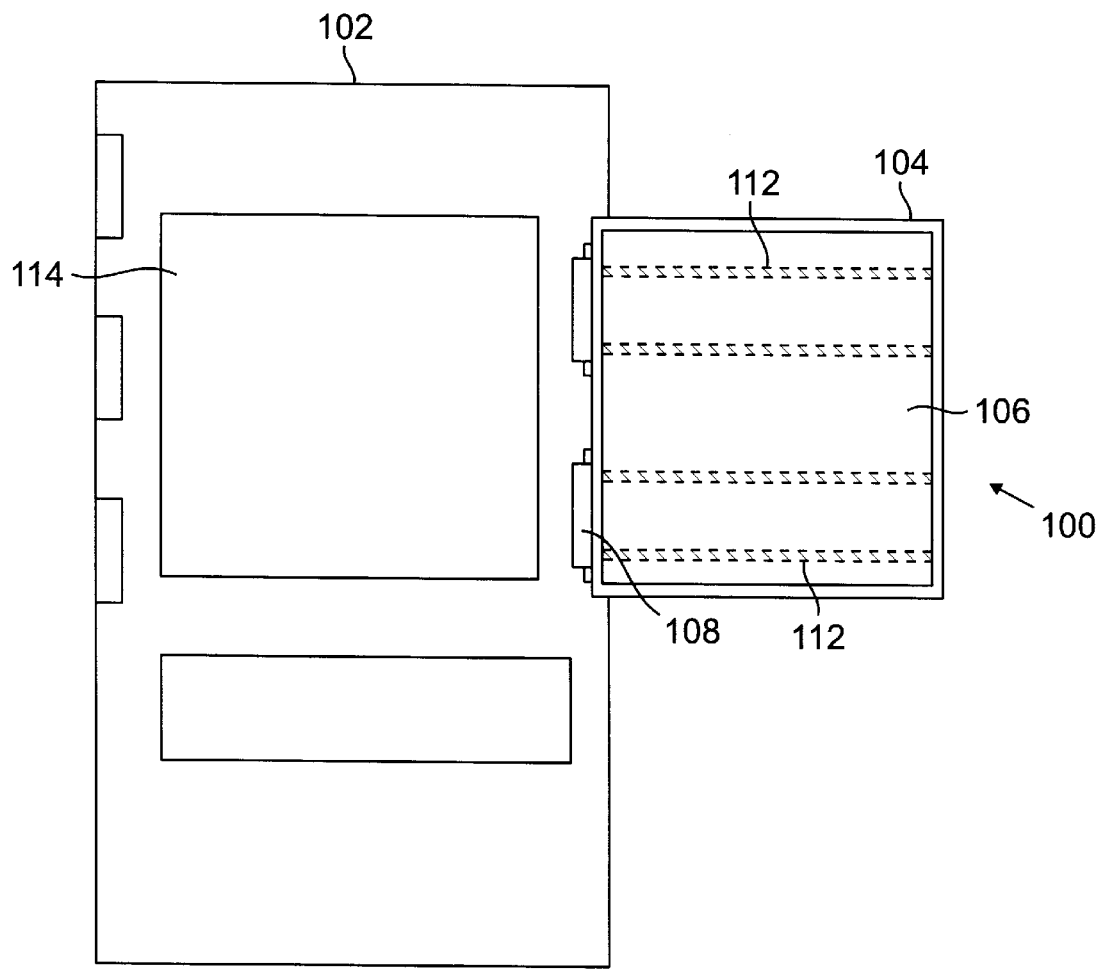
FIGS. 1A–B depicts different views of a high-level diagram of a system for extracting heat from a printed circuit board assembly (PBA) according to an embodiment of the present invention.
Figure 1B:
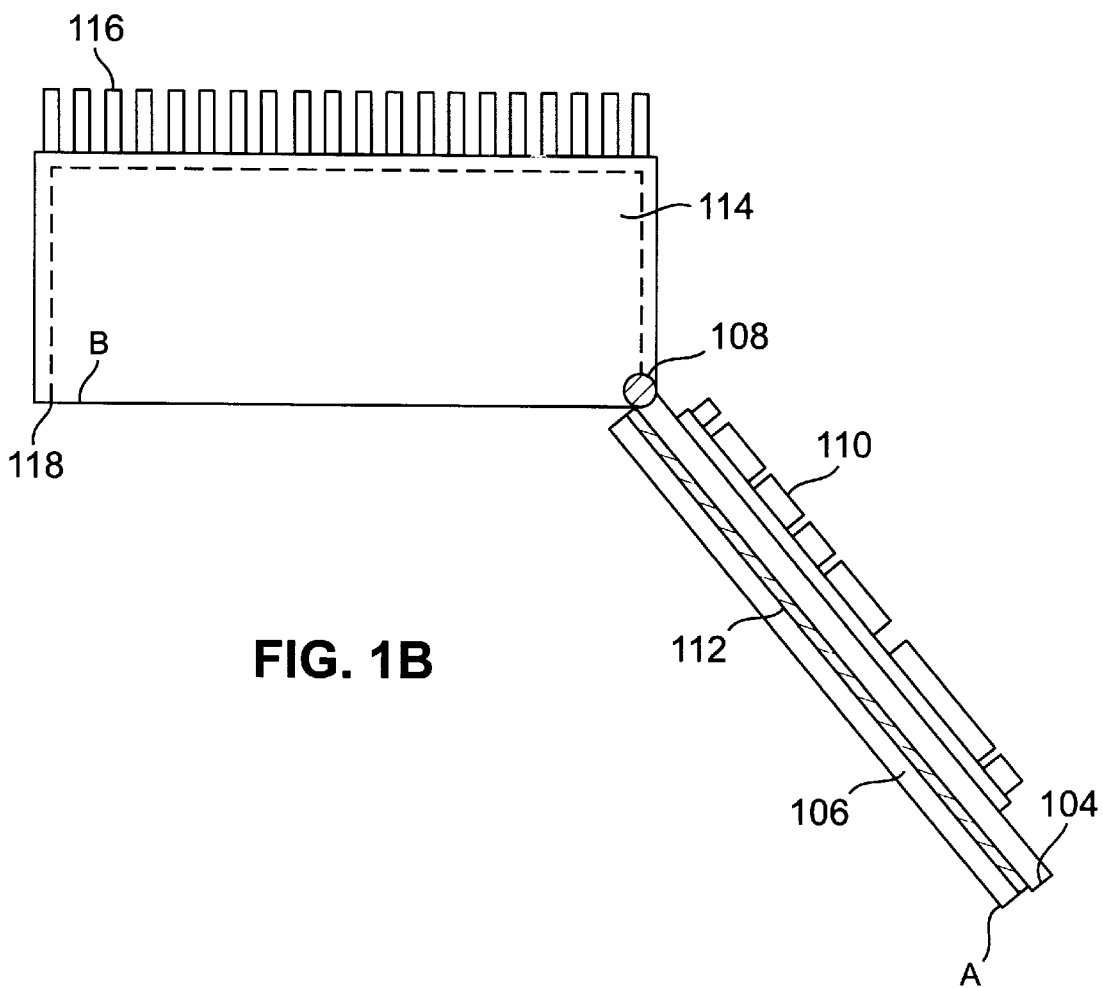

FIGS. 1A–1B depict different views of a high-level diagram of a system for extracting heat from a printed circuit board assembly (PBA) according to an embodiment of the present invention. The system may be utilized in any installation that contains multiple PBAs. In FIG. 1A, the present invention is shown installed in radio unit housing (RU) 102 of a wireless Base Station (not shown). RU 102 contains multiple printed circuit board assemblies, all capable of generating heat. Shown is PBA hinged mounting assembly 100 comprising PBA mounting tray 104, thermal tray 106, heat pipes 112, and thermal hinges 108 of the radio unit housing 102. In FIG. 1B, a top view displays thermal tray 106, PBA mounting tray 104, PBA 110, thermal hinges 108, interior 114 of RU housing 102, cooling fins 116 and cross section 118 of RU housing 102.

During operation, PBA hinged mounting assembly 100 is rotated to a closed position with A on mounting assembly 100 joining B on RU housing 102. Forced air passing over mounting assembly 100 may provide some heat transfer but the most efficient, and majority of the total, heat transfer takes place by conduction via mounting tray 104, thermal tray 106 and thermal hinge 108. PBA 110 is enclosed, along with many other PBAs in a power amplifier housing. Individual heat producing devices that are installed on mounting assembly 100 may not produce very much heat individually, but when combined with all the others on the board in an enclosed space, the cumulative effect is significant. Forced air moving across the PBAs has been the only fairly effective method for removing heat buildup in an enclosure. The present invention transfers heat, by conduction, directly from thermal vias installed in PBA 110 into mounting tray 104. The heat transfer continues from mounting tray 104 onto thermal tray 106 and to thermal hinge 108 via heat pipes 112. In this embodiment, heat pipes 112 contain a liquid for transporting the heat to thermal hinge 108. However, heat pipes do not necessarily require liquid in order to function efficiently.

After the heat has transferred through heat pipes 112 to thermal hinges 108, the heat is then transferred to the radio unit housing 102. Heat is then, radiated to the ambient surroundings from housing 102 and heat transfer fins 116. All heat transfer, from PBA 110, through mounting tray 104, thermal tray 106, heat pipes 112, thermal hinges 108 and external housing 102, takes place by conduction. There are no moving parts and no heat sinks to take up room on the PBA. PBA 110 is easily available to repair and inspect and there are no moving parts which means low maintenance. Thermal hinge 108 allows efficient heat transfer to housing 102 and provides easy access to PBA 110.

Figure 2:
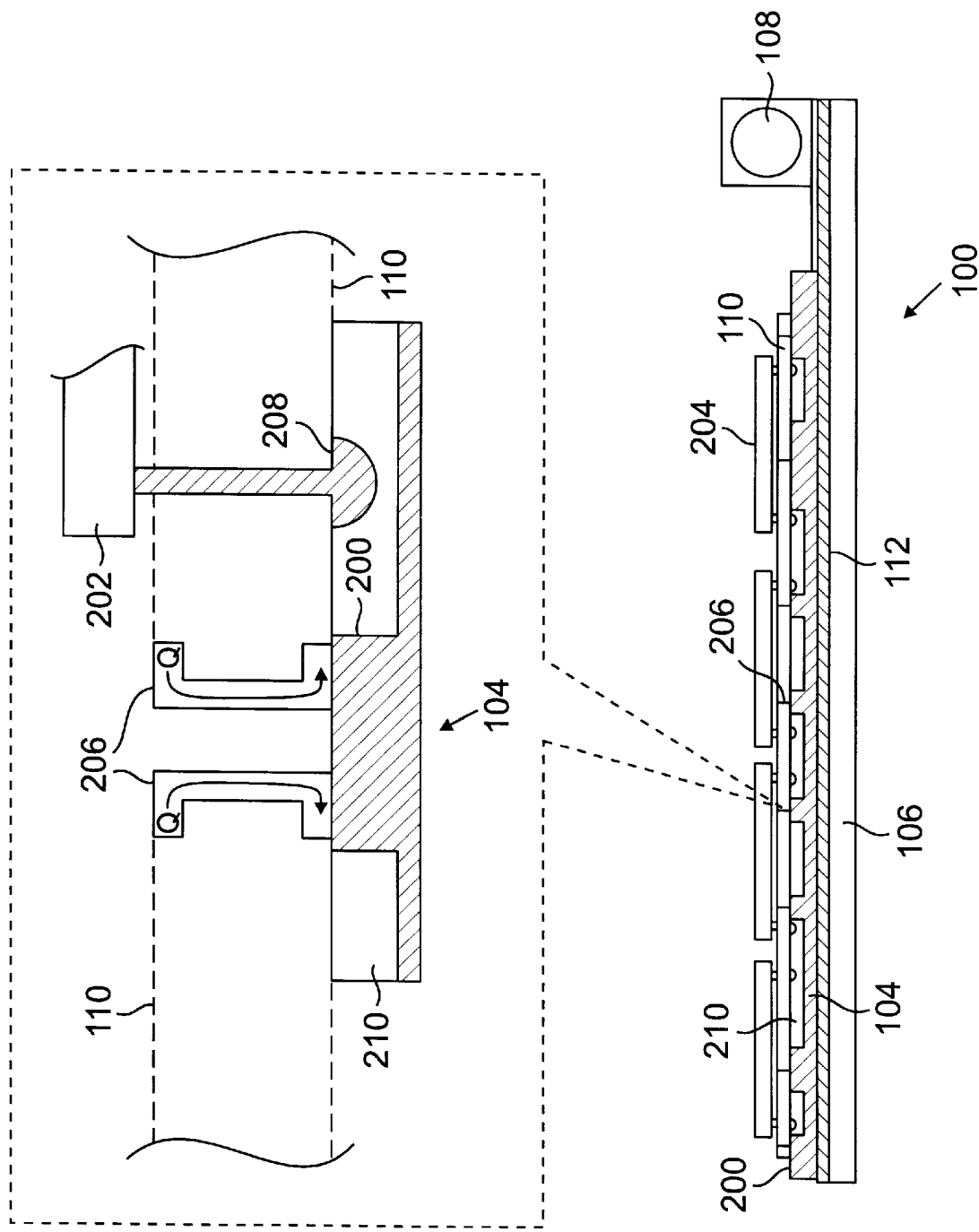
FIG. 2 illustrates a cross-section of a PBA installed in a system for extracting heat according to an embodiment of the present invention.

Referring to FIG. 2, a cross-section of a PBA installed in a system for extracting heat according to an embodiment of the present invention, is illustrated. PBA hinged mounting assembly 100 is shown in cross section. An enlarged view of thermal via 206 is also shown. PBA hinged mounting assembly 100 comprises thermal hinges 108 to which thermal tray 106 is mechanically and thermally connected. Heat pipes 112 are embedded in thermal tray 106. PBA hinged mounting assembly 100 also comprises mounting tray 104, lands 200 (i.e., raised portions of mounting tray), printed circuit board assembly (PBA) 110, and PCB devices 202. Also shown are thermal vias 206 that penetrate PBA 110 for conducting heat to mounting tray 104.

An enlarged view of thermal via 206 is shown wherein PCB 110 is mounted on mounting tray 104 and thermal via 206 is in thermal contact with mounting tray land 200. Also shown is PCB device 202 with solder connection 208. Solder connection 208 extends into space 210 which is an open area between lands to provide clearance for solder connections. Thermal via 206, in the enlarged view, is shown with arrows indicating the direction of heat transfer, "Q", from devices on PCB 110. There are multiple thermal vias incorporated into PCB 110 and all connect to mounting tray lands. Heat is transferred into the mounting tray land 200 and further, into mounting tray 104 itself. Referring to the cross-sectional view, heat is transferred, via the metal to metal contact between mounting tray 104 and thermal tray 106. The heat is transferred, via heat pipes 112 and thermal tray 106, to thermal hinge 108. The heat is then transferred to the metal enclosure of the radio unit and dissipated to the surrounding atmosphere.

Figure 3:
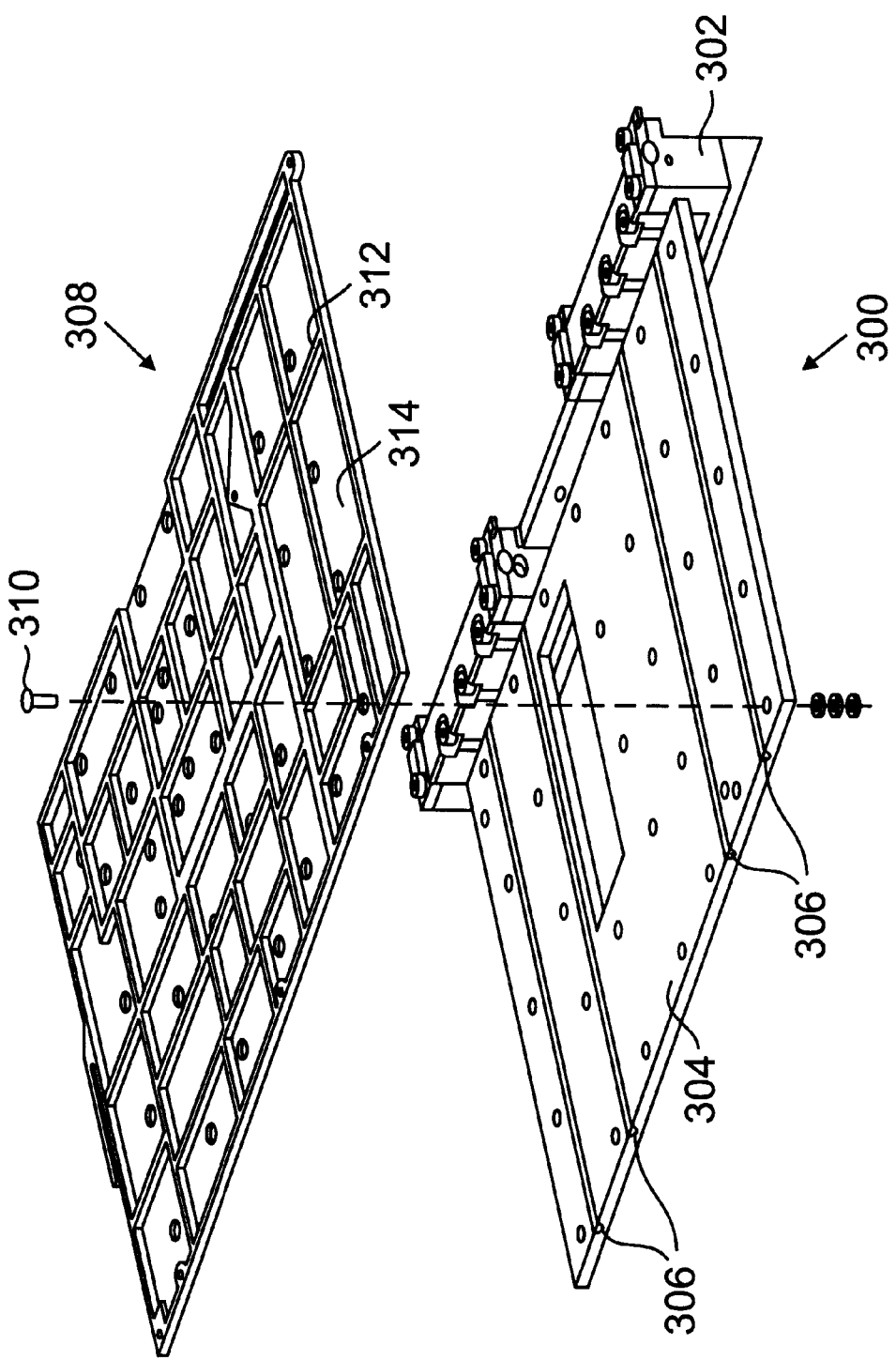
FIG. 3 depicts a perspective of an exemplary assembly of a system for extracting heat from a PBA in accordance with an embodiment of the present invention.

Referring now to FIG. 3, a perspective of an exemplary system for extracting heat from a PBA in accordance with an embodiment of the present invention is depicted. Heat transfer system 300 includes: thermal hinge 302, heat transfer tray 304, heat pipes 306, PBA mounting tray 308 and mounting hardware 310. Not shown in this figure is a printed circuit board assembly which would mount on top of PBA mounting tray 308, and "thermal vias" which mount between the printed circuit board assembly and PBA mounting tray 306. Thermal vias, as noted above, are devices that transfer heat from the printed circuit board assembly to mounting tray 308. Mounting tray lands 312 provide thermal contact between the thermal vias on the printed circuit board assembly and mounting tray 308. Open spaces 314 are provided to prevent solder connections on the bottom of the printed circuit board assembly from shorting to the metal mounting tray.

As illustrated, mounting tray 308 is shown with an exploded view of one example of mounting hardware 310. There are multiple mechanical connections between mounting tray 308 and thermal tray 304, so to simplify the figure, only one set of hardware is illustrated. Hardware for connecting the two trays is installed in open spaces 314 to prevent contact with exposed solder connections on the bottom of the printed circuit board assembly.

Thermal tray 304 comprises thermal hinge 302 and heat pipes 306. Heat pipes 306 in this embodiment are liquid filled but depending on configuration and heat transfer needs, may be filled with any fluid, including air. Heat is transferred through the thermal vias that are connected to mounting tray 308, and then to thermal tray 304. Even though contact between thermal tray 304 and mounting tray 308 is mechanical, both are metal trays and the hardware connections are at multiple points. This multiple point and metal to metal contact enhances the transfer of heat from mounting tray 308. Heat transferred to thermal tray 304 is then conducted to thermal hinge 302 via heat pipes 306. In turn, thermal hinge 302, mechanically connected to a metal housing (not shown) for the PBAs, transfers heat received from heat pipes 306 to the metal housing.

Figure 4:
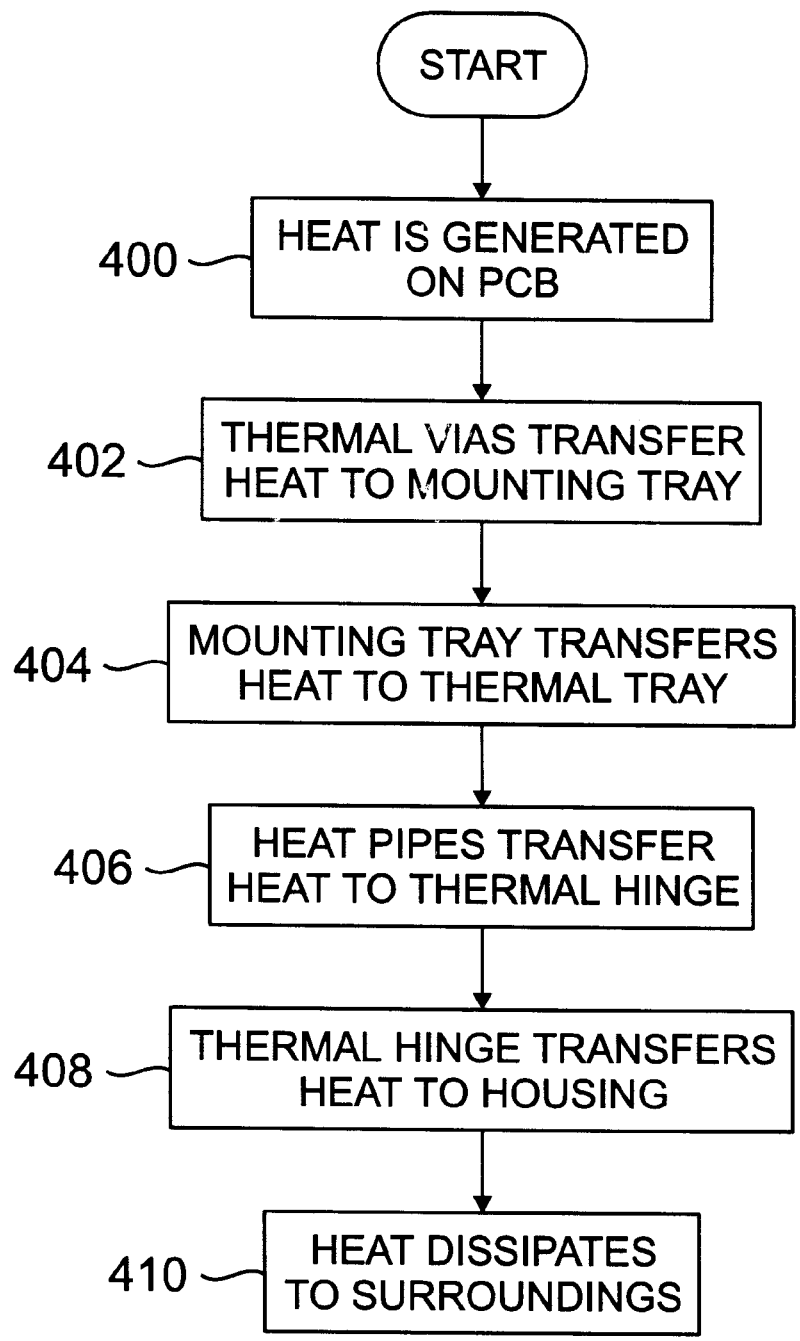
FIG. 4 is a high-level flow diagram illustrating the operation of the exemplary system for extracting heat from a PBA according to one embodiment of the present invention.

Referring to FIG. 4, a high-level flow diagram of the operation of the exemplary system for extracting heat from a PBA according to one embodiment of the present invention, is illustrated. The process begins with step 400, which depicts heat generated from individual devices on a printed circuit board assembly. The PBA is installed in a preferred embodiment of the present invention, including a mounting tray, thermal tray with heat pipes and thermal hinge for mounting to an enclosure. The process continues to step 402, which illustrates the generated heat being transferred from the devices on the PCB, utilizing thermal vias, to the mounting tray. The process then passes to step 404, which depicts the heat being transferred from the mounting tray, via mechanical and thermal contact, to the thermal tray.

The process then proceeds to step 406, which illustrates heat being transferred via embedded heat pipes in the thermal tray to a thermal hinge. The heat may be transferred due to the mechanical and thermal connection between the thermal tray and thermal hinge in addition to the heat transferred by the heat pipes. The process then passes to step 408, which depicts the heat being transferred to a heat dissipation apparatus (housing) external to the PCB, via the thermal hinge. Finally, the process proceeds to step 410, which illustrates the heat being rejected from the housing to the surrounding air. All heat transfer in the present invention is passively conducted away from the PCB assembly.

Previous methods of heat transfer from heat generating devices are usually confined to utilizing heat sinks and forced air. Heat generating devices generally require substantial surface areas. Utilizing heat sinks when there are many heat generating devices required on a single board, becomes cumbersome and sometimes impossible. The present invention utilizes a design that allows for a metal mounting tray to be thermally and mechanically joined. The metal mounting tray is designed to provide open spaces beneath solder connections and metal/thermal lands for connecting to thermal vias that are mounted on the underside of printed circuit boards. The metal mounting tray is used for mounting PBAs in an enclosure (metal) and for transferring heat to a more efficient heat transfer device. The heat transfer device—thermal tray and thermal hinge combination—removes heat from the metal tray and interior of the enclosure by conduction. The heat is then radiated by the external panels of the enclosure itself. Heat is transferred efficiently from devices that may be scattered across the printed circuit board assembly without the use for large, heat spreading devices or forced air cooling.

Although the present invention has been described in detail, those skilled in the art should understand that they can make various changes, substitutions and alterations herein without departing from the spirit and scope of the invention in its broadest form.

What is claimed is:

1. A system for extracting heat from a printed circuit board assembly, comprising:
   a mounting tray wherein said printed circuit board assembly is removably attached to a front side of said mounting tray, said front side of said mounting tray having portions that define a plurality of mounting tray lands; and
   a thermal tray thermally coupled to a back side of said mounting tray for transferring heat dissipated from scattered, heat producing devices mounted on said printed circuit board assembly through said plurality of mounting tray lands.

2. The system for extracting heat as set forth in claim 1, further comprising a plurality of thermal vias embedded in said printed circuit board assembly for transferring heat from said printed circuit board assembly to said mounting tray wherein at least one thermal via of said plurality of thermal vias is in thermal contact with at least one mounting tray land of said plurality of mounting tray lands of said mounting tray.

3. The system for extracting heat as set forth in claim 1, wherein said thermal tray further comprises a plurality of embedded heat pipes arranged to transfer heat from said plurality of mounting tray lands to an external heat dissipation device.

4. The system for extracting heat as set forth in claim 1, wherein said mounting tray has portions that define a plurality of mounting tray open spaces between said plurality of mounting tray lands.

5. The system for extracting heat as set forth in claim 4, wherein said plurality of mounting tray open spaces prevent exposed solder connections on a back side of said printed circuit board assembly from contacting said mounting tray.

6. The system for extracting heat as set forth in claim 1, further comprising a thermal hinge thermally coupled to said thermal tray for transferring heat from said plurality of mounting tray lands of said mounting tray to an external heat dissipation device.

7. The system for extracting heat as set forth in claim 2, wherein each thermal via of said plurality of thermal vias comprises an aperture through said printed circuit board assembly, said aperture having a metal lining.

8. The system for extracting heat as set forth in claim 7, wherein said metal lining of each thermal via of said plurality of thermal vias is in direct contact with a portion of a mounting tray land of said mounting tray.

9. The system for extracting heat as set forth in claim 6, wherein said mounting tray and said thermal tray are mechanically rotatable on said thermal hinge.

10. A base station in a wireless network capable of communicating with a plurality of mobile stations comprising:
    a radio unit capable of transmitting and receiving radio frequency (RF) signals comprising a plurality of printed circuit board assemblies; and
    a system for extracting heat from said plurality of printed circuit board assemblies comprising:
       a mounting tray wherein said printed circuit board assembly is removably attached to a front side of said mounting tray, said front side of said mounting tray having portions that define a plurality of mounting tray lands; and
       a thermal tray thermally coupled to a back side of said mounting tray for transferring heat dissipated from scattered, heat producing devices mounted on said printed circuit board assembly through said plurality of mounting tray lands.

11. The base station as set forth in claim 10, further comprising a plurality of thermal vias embedded in said printed circuit board assembly for transferring heat from said circuit board assembly to said mounting tray wherein at least one thermal via of said plurality of thermal vias is in thermal contact with at least one mounting tray land of said plurality of mounting tray lands of said mounting tray.

12. The base station as set forth in claim 10, wherein said thermal tray further comprises a plurality of embedded heat pipes arranged to transfer heat from said plurality of mounting tray lands to an external heat dissipation device.

13. The base station as set forth in claim 10, wherein said mounting tray has portions that define a plurality of mounting tray open spaces between said plurality of mounting tray lands.

14. The base station as set forth in claim 13, wherein said plurality of mounting tray open spaces prevent exposed solder connections on a back side of said printed circuit board assembly from contacting said mounting tray.

15. The base station as set forth in claim 10, further comprising a thermal hinge thermally coupled to said thermal tray for transferring heat from said plurality of mounting tray lands of said mounting tray to an external heat dissipation device.

16. The base station as set forth in claim 11, wherein each thermal via of said plurality of thermal vias comprises an aperture through said printed circuit board assembly, said aperture having a metal lining.

17. The base station as set forth in claim 16, wherein said metal lining of each thermal via of said plurality of thermal vias is in direct contact with a portion of a mounting tray land of said mounting tray.

18. The base station as set forth in claim 15, wherein said mounting tray and said thermal tray are mechanically rotatable on said thermal hinge.

19. A method for extracting heat from a printed circuit board assembly, comprising the steps of:

removably attaching said printed circuit board assembly to a front side of a mounting tray, said front side of said mounting tray having portions that define a plurality of mounting tray lands;

transferring heat dissipated from devices mounted on said printed circuit board assembly to said mounting tray through said plurality of mounting tray lands; and transferring heat from said mounting tray to an external heat dissipation device.

20. The method as claimed in claim 19 further comprising the steps of:

transferring heat from said printed circuit board assembly through a plurality of thermal vias embedded in said printed circuit board assembly to said mounting tray wherein at least one thermal via of said plurality of thermal vias is in thermal contact with at least one mounting tray land of said plurality of mounting tray lands of said mounting tray.

\* \* \* \* \*